United States Patent
Tu et al.

[11] Patent Number: 5,877,717
[45] Date of Patent: Mar. 2, 1999

[54] D/A CONVERTER WITH A GAMMA CORRECTION CIRCUIT

[75] Inventors: Nang-Ping Tu, Hsinchu; Yong-Nian Rau, Taichung; Chia-Yuan Chang, Taoyuan Hsien, all of Taiwan

[73] Assignee: Industrial Technology Research Institute, Hsinchu, Taiwan

[21] Appl. No.: 990,443

[22] Filed: Dec. 15, 1997

[51] Int. Cl.⁶ .................................................. H03M 1/88
[52] U.S. Cl. .......................... 341/150; 341/145; 341/138; 341/154
[58] Field of Search ........................... 341/138, 144–154

[56] References Cited

U.S. PATENT DOCUMENTS 5,724,036  3/1998  Kobayashi et al. .................... 341/138
5,739,805  4/1998  Dingwall ................................ 345/100
5,764,216  6/1998  Tanaka et al. ......................... 345/147

*Primary Examiner*—Howard L. Williams
*Attorney, Agent, or Firm*—Harness, Dickey & Pierce, P.L.C.

[57] ABSTRACT

A D/A converter with a Gamma correction circuit according to the invention is designed for C-DAC which takes up much less space than the conventional R-DAC and 2-divided C-DAC. Therefore, this D/A converter has advantages of simple design and low cost. Furthermore, users can freely define the shape of a Gamma correction conversion curve to thereby widen application areas by adjusting terminal voltages.

10 Claims, 4 Drawing Sheets

D/A CONVERTER WITH A GAMMA CORRECTION CIRCUIT

BACKGROUND OF THE INVENTION

1. Field of the Invention

The invention relates to a D/A converter, and in particular to a D/A converter with a Gamma correction circuit.

2. Description of Related Art

Generally, in a conventional digital-to-analog converter (DAC), an output voltage is required to have a linear relation with the input digital data. However, in certain special cases, an output voltage of the DAC must have a non-linear relation with the input digital data. For example, in liquid-crystal display (LCD) applications, the relation between the brightness and voltage of an LCD is not linear. Therefore, a correction circuit generally called a Gamma correction circuit is utilized for compensation.

FIG. 1 shows the structure of a R-DAC with a Gamma correction circuit according to the prior art. In this conventional R-DAC, digital data D0~D5 are decoded by the use of a ROM decoder, and then a voltage-dividing resistor is selected from a reference voltage generator 2 to output a corresponding voltage. The above-mentioned approach is simple, but taking an LCD application as an example, the number of gray levels varies directly with the space occupied by its structure. For example, the area of the R-DAC with 256 gray levels is 5.3 times that of the R-DAC with 64 gray levels. Therefore, in the LCD application, the DAC occupies most of the area of a data driver.

FIG. 2 is a circuit diagram of a 2-divided C-DAC with a Gamma correction circuit. Even though the area of the 2-divided C-DAC is smaller than that of the R-DAC, many capacitors which take up a large area are used. Therefore, the area of the 2-divided C-DAC can be further reduced.

SUMMARY OF THE INVENTION

In view of the above, the first object of the invention is to provide a D/A converter with a Gamma correction circuit which has a simple structure, and the area of which is much smaller than those of the conventional R-DAC and 2-divided C-DAC. Therefore, its circuit design is simplified and the manufacturing cost is reduced.

The second object of the invention is to provide a D/A converter with a Gamma correction circuit, wherein the shape of a Gamma correction conversion curve can be freely defined by users by adjusting their terminal voltages, thereby enhancing the range of applications.

To attain these objects, a D/A converter with a Gamma correction circuit according to the invention which receives N-bit digital data and outputs a corresponding analog voltage, comprises:

a plurality of terminal voltage sources;

a terminal voltage selector, the input terminals of which are connected to the plurality of terminal voltage sources;

a first decoder for decoding the k highest bits of the N-bit digital data so as to control the terminal voltage selector, thereby outputting corresponding voltages, a first voltage and a second voltage, with adjacent voltage values, wherein the value of the first voltage is smaller than that of the second voltage;

a second decoder for receiving and then decoding a plurality of sets of m-bit digital data, wherein the sets of m-bit digital data are obtained by dividing the N-k lowest bits of the N-bit digital data into $[(N-k)/m]$ sets of m-bit digital data which are decoded in ascending order, wherein the $[(N-k)/m]$ denotes a smallest integral number which is greater than or equal to the $(N-k)/m$;

a voltage-dividing selector for equally dividing the voltage difference between the first voltage and second voltage into $2^m-2$ node voltages, wherein the values of the $2^m-2$ node voltages are between the first voltage and second voltage, and then selecting and outputting a corresponding voltage of each set of m-bit digital data from the first voltage, second voltage and node voltages, according to an output control of the second decoder;

a first switch, a second switch, a third switch, and a fourth switch, which are connected to each other in series and are coupled between the output of the voltage-dividing selector and ground;

a fifth switch and a sixth switch which are connected to each other in series and are coupled between the output of the voltage-dividing selector and ground;

a first capacitor coupled between the connecting nodes of the first switch, second switch, and ground;

a second capacitor, one terminal of which is connected to the connecting points of the third switch and second switch, and the other terminal of which is connected to the connecting nodes of the fifth switch and sixth switch;

a third capacitor connected in parallel across the fourth switch;

a fourth capacitor coupled between the output of the voltage-dividing selector and ground, wherein the charges of the first capacitor through the third capacitor are re-distributed to combine the corresponding voltages of those sets of m-bit digital data into an analog voltage which is output from the connecting nodes of the second capacitor, second switch and third switch by the operations of the first switch through the sixth switch.

Furthermore, the operations of the switches 1~6 comprise the following steps:

(a) the first switch and sixth switch are turned off while the third switch through fifth switch are turned on, thereby discharging the first capacitor through the third capacitors until their potentials are equal to ground potential, and at this time, one set of m-bit digital data is decoded by the second decoder to cause the voltage-dividing selector to output a corresponding voltage;

(b) the first switch, fourth switch and fifth switch are turned on while the second switch, third switch and sixth switch are turned off, thereby charging the first capacitor with the output voltage of the voltage-dividing selector;

(c) the first switch, fourth switch and sixth switch are turned off while the second switch, third switch and fifth switch are turned on, thereby re-distributing the charges stored in the first capacitor with the participation of the second capacitor and third capacitor, and at this moment the next set of m-bit digital data is decoded by the second decoder to cause the voltage-dividing selector to output a corresponding voltage;

(d) steps (b) and (c) are repeated until the last set (the highest set) of m-bit digital data is completely decoded to cause the voltage-dividing selector to output a corresponding voltage; and (e) the first switch, second switch, third switch and fifth switch are turned off while the fourth switch and sixth switch are turned on, so that the fourth capacitor is charged by the corresponding voltage of the last set of m-bit digital data and, finally, the voltage value of the second capacitor plus that of the fourth capacitor is the output voltage of the D/A converter.

BRIEF DESCRIPTION OF THE DRAWINGS

The present invention will become more fully understood from the detailed description given herein and the accompanying drawings which are given by way of illustration only, and thus do not limit the present invention, and wherein.

DETAILED DESCRIPTION OF THE INVENTION

Figure 1:
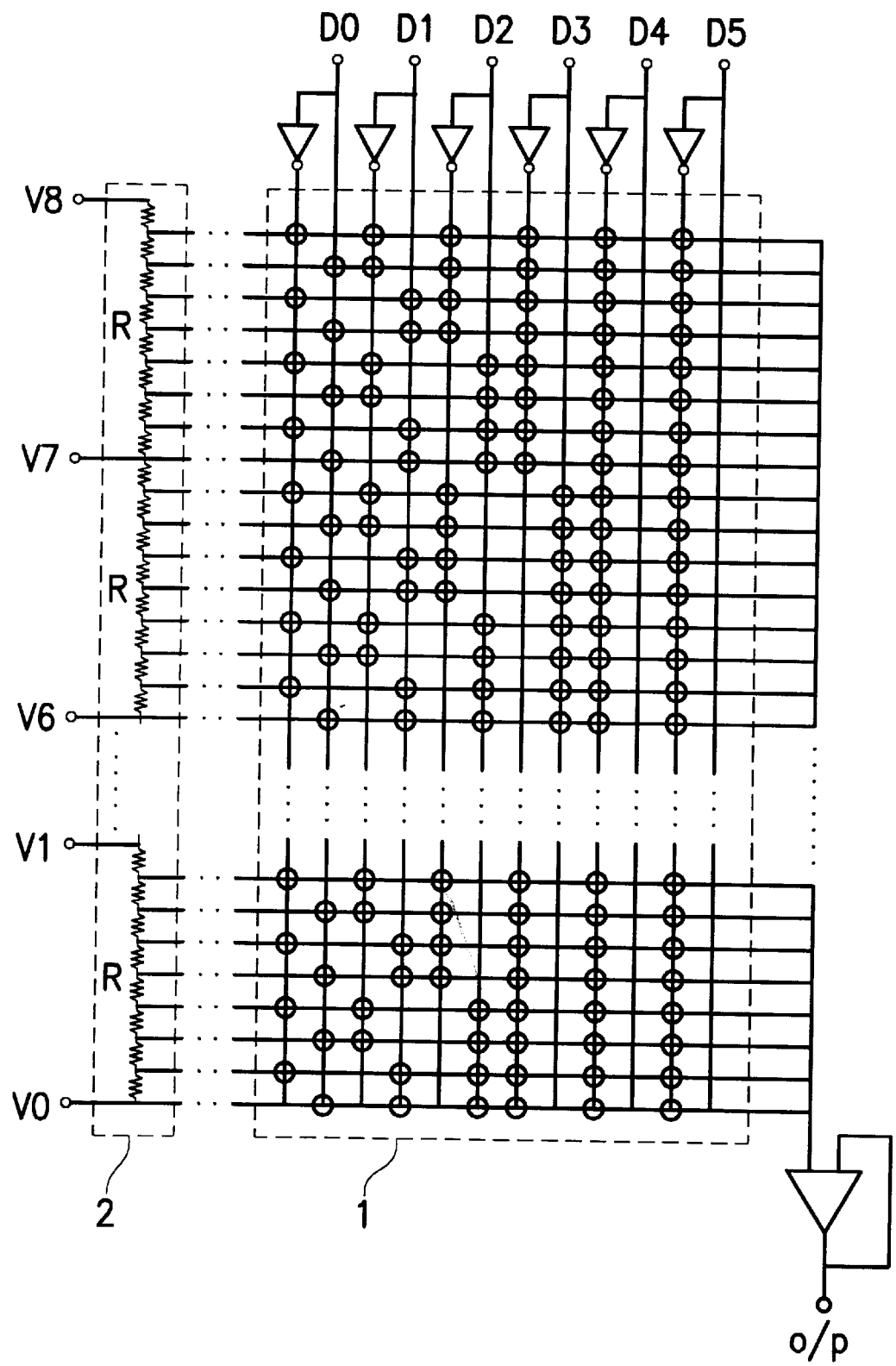
FIG. 1 is a circuit diagram of a conventional R-DAC.
Figure 2:
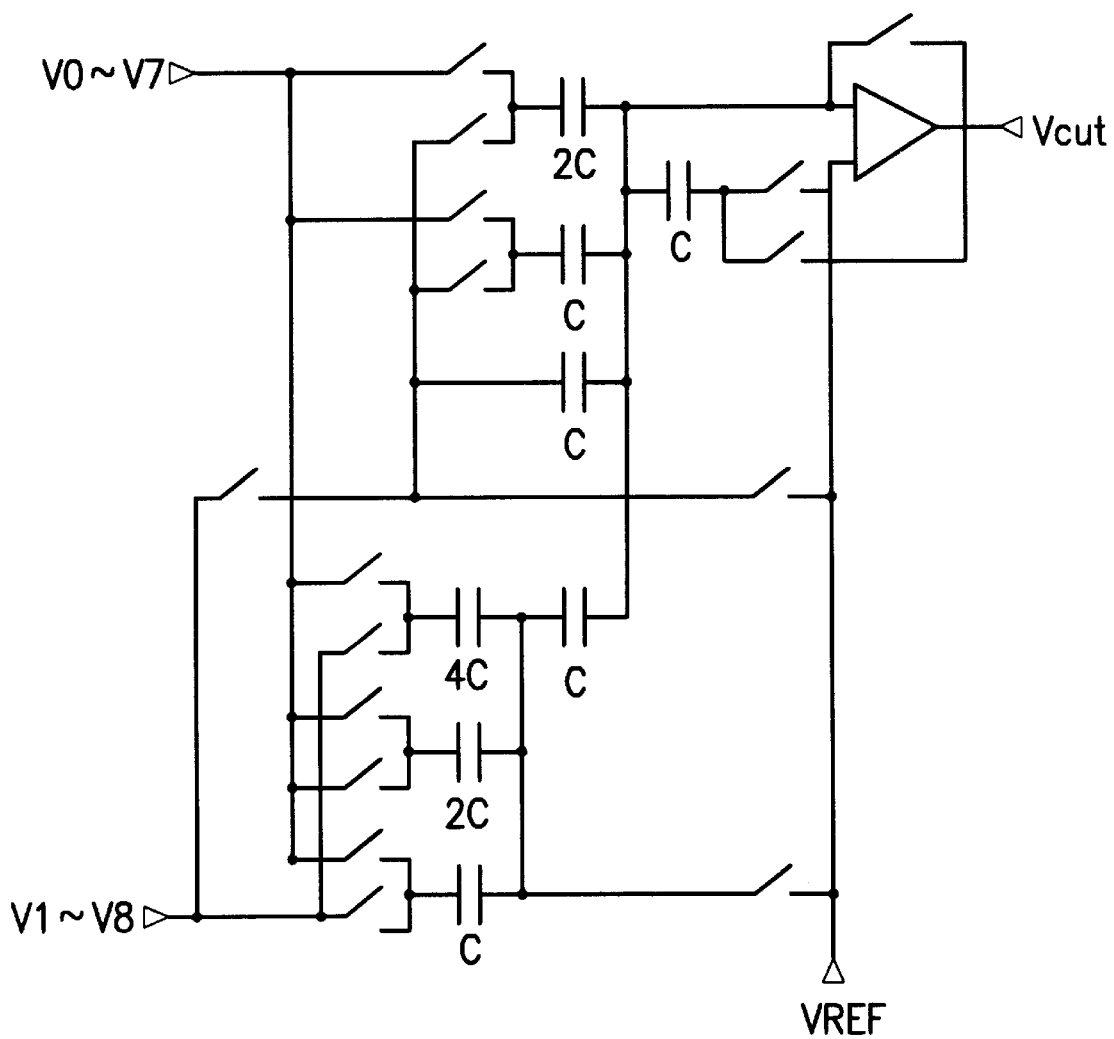
FIG. 2 is a circuit diagram of a conventional 2-divided C-DAC.
Figure 3:
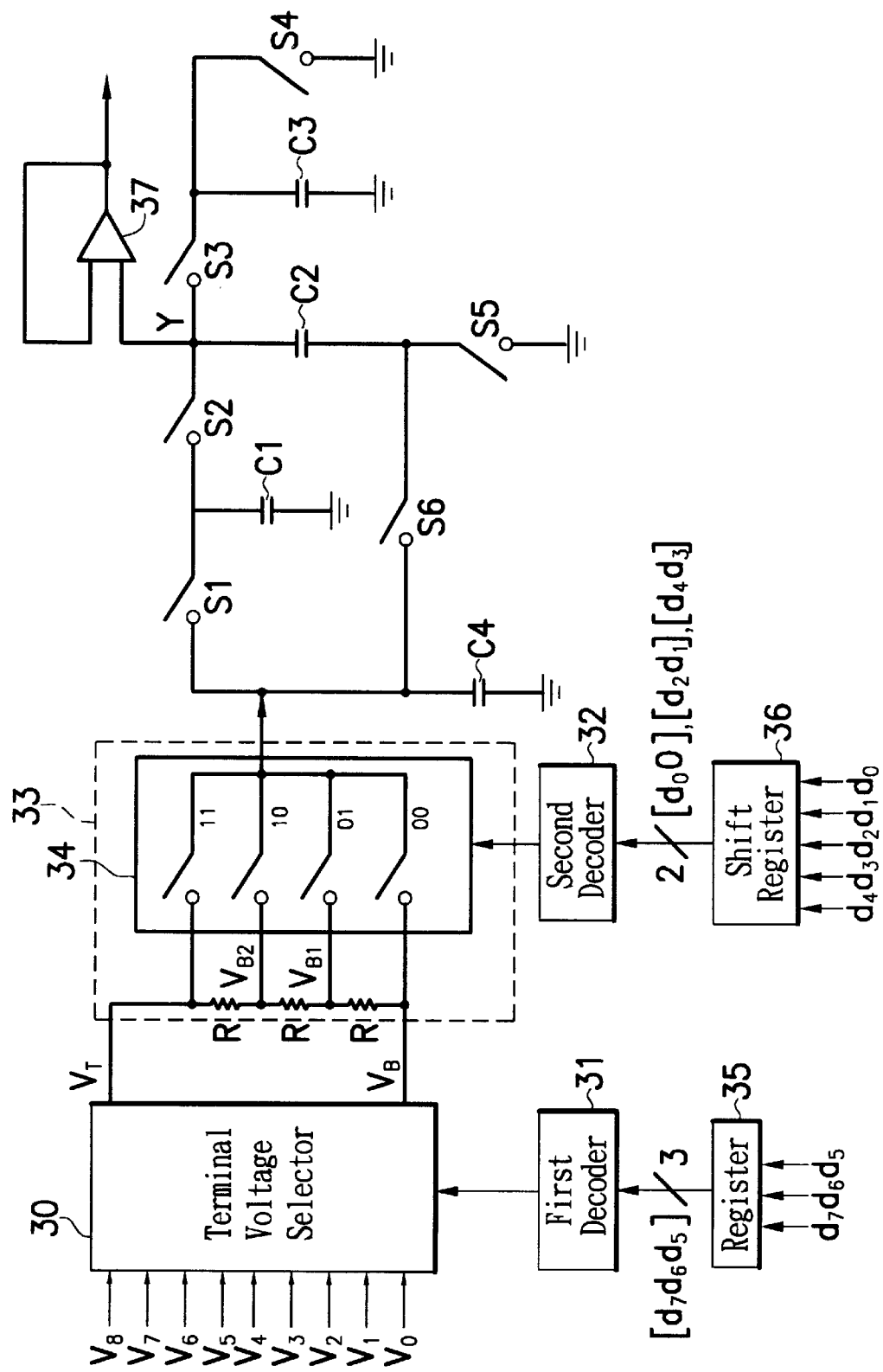
FIG. 3 is a circuit diagram of a D/A converter according to a preferred embodiment of the invention.

FIG. 3 is a circuit diagram illustrating a D/C converter according to a preferred embodiment of the invention. In this embodiment, a D/A converter with 256 (or $2^N$) gray levels is provided as an example, wherein its input digital data are 8-bit (or N-bit) data $[d_7\ d_6\ d_5\ d_4\ d_3 d_2 d_1\ d_0]$.

As shown in FIG. 3, a D/A converter with a Gamma correction circuit according to the invention comprises:

Nine (9) (or $2^k+1$) terminal voltage sources $V_0 \sim V_8$ (or $V_2^k$) which are adjusted to determine the shape of a Gamma correction curve, wherein $V_0 < V_1 < \ldots V_8$ (or $V_2^k$);

a terminal voltage selector 30, the input terminals of which are coupled to the terminal voltage sources $V_0 \sim V_8$, respectively;

a first decoder 31 for decoding 3 (or k) highest bits $[d_7\ d_6\ d_5]$ to thereby control the terminal voltage selector 30 to obtain a corresponding first voltage $V_B$ and second voltage $V_T$ with adjacent voltage values, wherein the value of the first voltage $V_B$ is less than that of the second voltage $V_T$ (for example, if the $[d_7\ d_6\ d_5]$ is [0 1 1], the terminal voltages $V_3$ and $V_4$ are selected as the first voltage $V_B$ and the second voltage $V_T$, respectively, while if the $[d_7\ d_6\ d_5]$ is [1 1 1], the terminal voltages $V_7$ and $V_8$ are selected as the first voltage $V_B$ and the second voltage $V_T$, respectively);

a second decoder 32 for receiving and then decoding 3 sets of 2-bit (m-bit, where m=2) digital data $[d_4\ d_3]$, $[d_2\ d_1]$ and $[d_0\ 0]$, wherein 3 sets of 2-bit digital data are obtained by dividing the 5 lowest bits (N-k lowest bits, where N=8 and k=3) of digital data of the 8-bit (N-bit, where N=8) digital data in descending order, wherein one "0" is added to the last divided set of 2-bit digital data that does not contain 2 bits to make a complete set of digital data $[d_0\ 0]$;

a voltage-dividing selector 33 for equally dividing the voltage difference between the first voltage $V_B$ and second voltage $V_T$ into 2 ($2^m-2$, where m=2) node voltages with voltage values between the first voltage $V_B$ and second voltage $V_T$, and then selecting and outputting a corresponding voltage from the first voltage $V_B$, node voltages $V_{B1}$ and $V_{B2}$ and second voltage $V_T$, according to an output control of the second decoder 32, wherein the voltage-dividing selector 33 comprises a voltage-dividing network which consists of 3 ($2^m-1$, where m=2) resistors with a constant proportion connected to each other in series and coupled between the first voltage $V_B$ and the second voltage $V_T$, thereby obtaining 2 ($2^m-2$, where m=2) node voltages; and a selector 34, the input terminals of which are connected to the first voltage $V_B$, node voltages $V_{B1}$ and $V_{B2}$, and second voltage $V_T$, respectively, for selecting and outputting corresponding voltages in order, based on the output controls of the second decoder 32. In other words, there are 4 possible sets of 2-bit digit data 00, 01, 10 and 11 which correspond to the output voltages $V_B$, $V_{B1}$, $V_{B2}$ and $V_T$ of the selector 34, respectively;

a first switch S1, a second switch S2, a third switch S3 and a fourth switch S4 connected to each other in series and coupled between the output of the voltage-dividing selector 33 and ground;

a sixth switch S6 and a fifth switch S5 connected to each other in series and coupled between the output of the voltage-dividing selector 33 and ground;

a first capacitor C1 coupled between the connecting node of the first switch S1, the second switch S2, and ground;

a second capacitor C2, one terminal of which is connected to the connecting node of the second switch S2 and third switch S3, and the other terminal of which is connected to the connecting terminal of the fifth switch S5 and sixth switch S6;

a third capacitor C3 connected in parallel across the fourth switch S4; and a fourth capacitor C4 connected between the output terminal of the voltage-dividing selector 33 and ground.

In addition, the proportion of capacitance values among the first capacitor C1, second capacitor C2 and third capacitor C3 is 1:1:2 (1:1:$2^m$-2, where m=2).

In a D/A converter according to a preferred embodiment of the invention, the operations of the switches S1~S6 are controlled by a timing control circuit (not shown) to re-distribute the charges of the capacitors C1~C4, thereby combining the corresponding voltages of 3 sets of 2-bit digital data into an analog output voltage which is output from the connecting node of the second capacitor C2 and switches S2 and S3. Moreover, the switches can be replaced with MOS transistors, wherein their gates receive the control signals of the timing control circuit to achieve required operations.

Assume that 8-bit digital data $[d_7\ d_6\ d_5\ d_4\ d_3\ d_2 d_1\ d_0]$ are [1 0 0 0 0 1 1 1]. Referring to FIG. 3, high-bit data $[d_7\ d_6\ d_5]$ which are [1 0 0] stored in a register 35, are decoded to control the terminal voltage selector 30, thereby outputting terminal voltages $V_4$ and $V_5$ (not shown) which act as the first voltage $V_B$ and second voltage $V_T$, respectively.

Next, through the control of the timing control circuit (not shown), $[d_0\ 0]$, $[d_2\ d_1]$ and $[d_4\ d_3]$ which are output in order from a register 36, are decoded by the second decoder. After obtaining the first voltage $V_B$ and second voltage $V_T$, the digital-to-analog conversion is performed according to Table 1, and comprises the following steps, wherein "1" denotes an on-state while "0" denotes an off-state.

TABLE 1

| Step | S1 | S2 | S3 | S4 | S5 | S6 | Decode |
|------|----|----|----|----|----|----|--------|
| 1 | 0 | 1 | 1 | 1 | 1 | 0 | $[d_0\ 0]$ |
| 2 | 1 | 0 | 0 | 1 | 1 | 0 | N.A. |
| 3 | 0 | 1 | 1 | 0 | 1 | 0 | $[d_2\ d_1]$ |
| 4 | 1 | 0 | 0 | 1 | 1 | 0 | N.A. |
| 5 | 0 | 1 | 1 | 0 | 1 | 0 | $[d_4\ d_3]$ |
| 6 | 0 | 0 | 0 | 1 | 0 | 1 | N.A. |

Step 1

The first switch S1 and the sixth switch S6 are turned off while the second switch S2 through the fifth switch S5 are turned on, thereby discharging the first capacitor C1 through the third capacitor C3 until their potentials are the same as ground potential, and at this time, one set of 2-bit digital data [d_0 0] ([1 0]) is decoded by the second decoder 32 to cause the voltage-dividing selector 34 to output a corresponding voltage $V_{B2}$.

Step 2

The first switch S1, the fourth switch S4 and the fifth switch S5 are turned on while the second switch S2, the third switch S3 and the sixth switch S6 are turned off, thereby charging the first capacitor C1 by the output voltage $V_{B2}$ of the voltage-dividing selector until the voltage of the first capacitor C1 reaches $V_{B2}$.

Step 3

The first switch S1, the fourth switch S4 and the sixth switch S6 are turned off while the second switch S2, the third switch S3 and the fifth switch S5 are turned on, so that the charges stored in the first capacitor C1 are re-distributed with the participation of the second capacitor C2 and third capacitor C3. Since C1:C2:C3=1:1:2, the voltage $V_{sum}$ of the second capacitor C2 is equal to $V_{B2} \times C1/(C1+C2+C3)=V_{B2}/4$. At this moment, the next set of 2-bit digital data [d2 d1] ([1 1]) are decoded by the second decoder 32 to cause the voltage-dividing selector 33 to output a corresponding voltage.

Step 4

The first switch S1, the fourth switch S4 and the fifth switch S5 are turned off while the second switch S2, the third switch S3 and the sixth switch S6 are turned on. At this point, the first capacitor C1 is charged by the output voltage $V_T$ of the voltage-dividing selector 33 until its potential is equal to $V_T$.

Step 5

The first switch S1, the fourth switch S4 and the sixth switch S6 are turned off while the second switch S2, the third switch S3 and the fifth switch S5 are turned on, so that the charges of the first capacitor C1 are re-distributed with the participation of the second capacitor C2 and the third capacitor C3. Therefore, the voltage $V_{sum}$ of the second capacitor C2 can be written as:

$$V_{sum}=(C1 \times V_T+C2 \times V_{B2}/4)/(C1+C2+C3)=V_T/4+V_{B2}/16$$

At this time, the next set of 2-bit digital data [d3 d4] ([0 0]) are decoded by the second decoder 32 to cause the voltage-dividing selector 33 to output a corresponding voltage $V_B$.

Step 6

The first switch S1, second switch S2, third switch S3 and fifth switch S5 are turned off while the fourth switch S4 and sixth switch S6 are turned on, so that the fourth capacitor C4 is charged by the corresponding voltage $V_B$ of the highest set of 2-bit digital data [d4 d3] until the C4 reaches a potential $V_B$. Therefore, the voltage $V_Y$ at an output point Y is raised, and can be represented by:

$$V_Y V_{sum}+V_B=V_B+V_T/4+V_{B2}/16.$$

Finally, the voltage $V_Y$ at the point Y is output via an output buffer 37. In other words, the voltage $V_Y$ is a required analog output voltage from the D/A converter.

Furthermore, the comparisons between the C-DAC according to the invention and the conventional 2-divided C-DAC, each with 256 gray levels and an 8-step gamma correction curve, are listed on Table 2.

TABLE 2

| | Number of resistors | Number of capacitors | Number of MOSs | Number of power source wires |
|---|---|---|---|---|
| R-DAC | 256 | N.A. | 4096 | 256 |
| 2-divided | N.A. | 16 | 400 | 9 |
| Invention | 4 | 5 | 300 | 9 |

As is evident from the above, a minimal amount of elements are used in the C-DAC according to the invention. Moreover, since the area occupied by resistors used in the C-DAC according to the invention is less than that only occupied by a capacitor, the qualities of the conventional 2-divided C-DAC are greatly improved.

Figure 4:
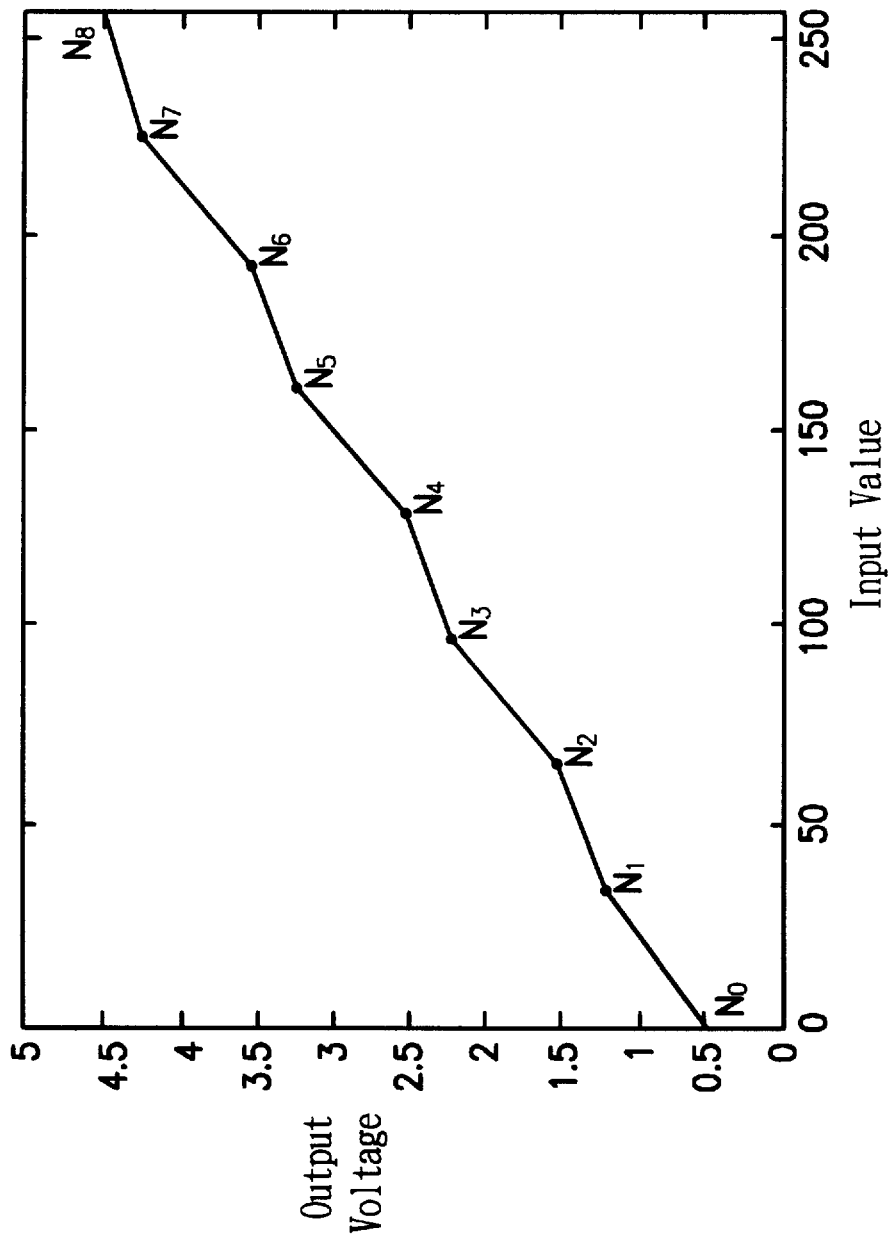
FIG. 4 is a graph illustrating a Gamma correction conversion curve of a DAC with 256 gray levels.

FIG. 4 depicts a conversion curve of a DAC with 256 gray levels. This conversion curve is an 8-step Gamma correction curve, wherein points $N_0 \sim N_8$ correspond to the terminal voltages $V_0 \sim V_8$. If the terminal voltages $V_0 \sim V_8$ are adjusted into an arithmetic progression, the Gamma correction curve changes into a linear conversion curve as that of the conventional DAC. Furthermore, in a DAC according to the invention, users can freely define the shape of a required Gamma correction curve to flexibly enhance the range of applications.

Although the invention has been disclosed in terms of a preferred embodiment, the disclosure is not intended to limit the invention. Those knowledgeable in the art can make modifications within the scope and spirit of the invention which is determined by the claims below.

What is claimed is:

1. A D/A converter with a Gamma correction circuit, which receives N-bit digital data and then outputs a corresponding analog voltage, comprising:

a plurality of terminal voltage sources;

a terminal voltage selector, the input terminals of which are coupled to said terminal voltage sources;

a first decoder which decodes the k highest bits of said N-bit digital data, thereby controlling said terminal voltage selector to obtain a corresponding first voltage and a second voltage from said terminal voltage sources, wherein the value of said first voltage is less than that of said second voltage;

a second decoder which receives and then decodes a plurality of sets of m-bit digital data in ascending order, wherein said sets of m-bit digital data are obtained by dividing N-k lowest bits of said N-bit digital data;

a voltage-dividing selector which equally divides the voltage difference between said first voltage and said second voltage into $2^m-2$ node voltages with values between said first voltage and said second voltage, and then selects and outputs corresponding voltages of said sets of m-bit digital data from said first voltage, said node voltages and said second voltages according to the output controls of said second decoder;

a first switch, a second switch, a third switch and a fourth switch connected to each other in series and coupled between the output of said voltage-dividing selector and ground;

a sixth switch and a fifth switch connected to each other in series and coupled between the output of said voltage-dividing selector and ground;

a first capacitor coupled between the connecting node of said first switch, said second switch, and said ground;

a second capacitor, one terminal of which is connected to the connecting node of said second switch and said third switch, and the other terminal of which is connected to the connecting node of said sixth switch and said fifth switch;

a third capacitor connected in parallel across said fourth switch; and a fourth capacitor coupled between the output of said voltage-dividing selector and said ground, wherein the charges of said first capacitor through said fourth capacitor are re-distributed by controlling the operations of said first switch through said sixth switch to combine the corresponding voltages of said sets of m-bit digital data into an analog voltage output from the connecting node of said second capacitor, said second switch and said third switch.

2. A D/A converter as claimed in claim 1, wherein the operations of said first switch through said sixth switch are as follows:

(a) said first switch and said sixth switch are turned off while said second switch and said fifth switch are turned on, thereby discharging said first capacitor through said third capacitor until potentials thereof are the same as that of ground potential, and at this time, the lowest set of m-bit digital data is decoded by said second decoder to cause said voltage-dividing selector to output a corresponding voltage;

(b) said first switch, said fourth switch and said fifth switch are turned on while said second switch, third switch and sixth switch are turned off, thereby charging said first capacitor by the output voltage of said voltage-dividing selector;

(c) said first switch, fourth switch and sixth switch are turned off while said second switch, third switch and fifth switch are turned on, thereby re-distributing the charges stored in the first capacitor with the participation of said second capacitor and third capacitor, and at this moment, the next set of m-bit digital data is decoded by said second decoder to cause said voltage-dividing selector to output a corresponding voltage;

(d) steps (b) and (c) are repeated until the last set (the highest set) of m-bit digital data is completely decoded to cause said voltage-dividing selector to output a corresponding voltage; and (e) said first switch, said second switch, said third switch and said fifth switch are turned off while said fourth switch and sixth switch are turned on, so that the fourth capacitor is charged by the corresponding voltage of said last set of m-bit digital data, and finally, the voltage value of the second capacitor plus the voltage value of the fourth capacitor is the output voltage of the D/A converter.

3. A D/A converter as claimed in claim 1, wherein the proportion among said first capacitor, second capacitor and third capacitor is $1:1:2^m-2$.

4. A D/A converter as claimed in claim 1, wherein the number of said terminal voltage sources is $2^k+1$ which forms $2^k$ voltages, wherein corresponding voltages are determined from said $2^k$ voltages by decoding the k highest bits of said N-bit digital data.

5. A D/A converter as claimed in claim 1, wherein the N-k lowest bits of said N-bit digital data are divided into a plurality of sets of m-bit digital data in descending order, and if the last set of m-bit digital data is not sufficient for m bits, the required number of "0s" are added to the right-hand side thereof to completely match the m bits.

6. A D/A converter as claimed in claim 1, wherein said voltage-dividing selector comprises:

a voltage-dividing network consisting of $2^m-1$ proportion-equal resistors connected to each other in series, coupled between said first voltage and said second voltage for obtaining $2^m-2$ node voltages; and a selector, the inputs of which are coupled to said first voltage, $2^m-2$ node voltages and second voltage, for selecting and then outputting corresponding voltages, according to output controls which are generated by decoding said sets of m-bit digital data by said second decoder.

7. A D/A converter as claimed in claim 1, further comprising:

a timing controller for controlling the operations of said first switch through said sixth switch;

a shift register for storing said N-k bits digital data and outputting said sets of m-bit digital data in ascending order for being decoded by said second decoder; and a register for storing said k bits digital data and then inputting said k bits digital data to said first decoder.

8. A D/A converter as claimed in claim 1, wherein said N, k and m all are positive integral numbers, wherein N is more than k.

9. A D/A converter as claimed in claim 1, wherein said first switch through said sixth switch can be replaced with MOS transistors.

10. A D/A converter as claimed in claim 1, wherein the set number of said m-bit digital data is $[(N-k)/m]$, wherein $[(N-k)/m]$ denotes the smallest number greater than or equal to $(N-k)/m$.

* * * * *